(12) United States Patent
Lange et al.

(10) Patent No.: US 7,531,895 B2
(45) Date of Patent: May 12, 2009

(54) INTEGRATED CIRCUIT PACKAGE AND METHOD OF MANUFACTURE THEREOF

(75) Inventors: Bernhard Lange, Freising (DE); William David Boyd, Frisco, TX (US)

(73) Assignee: Texas Instruments Incorporated, Dallas, TX (US)

(*) Notice: Subject to any disclaimer, the term of this patent is extended or adjusted under 35 U.S.C. 154(b) by 58 days.

(21) Appl. No.: 11/552,803

(22) Filed: Oct. 25, 2006

(65) Prior Publication Data

US 2007/0057361 A1    Mar. 15, 2007

Related U.S. Application Data

(63) Continuation-in-part of application No. 11/066,875, filed on Feb. 25, 2005, now abandoned.

(51) Int. Cl.
*H01L 23/49* (2006.01)
*H01L 23/495* (2006.01)

(52) U.S. Cl. .............. 257/696; 257/697; 257/675; 257/E23.024; 257/E23.048

(58) Field of Classification Search ............... 257/675, 257/696, 697, E23.024, E23.048
See application file for complete search history.

(56) References Cited

U.S. PATENT DOCUMENTS

| | | | |
|---|---|---|---|
| 4,209,798 A | 6/1980 | Beretta | |
| 4,393,581 A * | 7/1983 | Cherian | 29/827 |
| 5,096,425 A * | 3/1992 | Takahashi | 439/55 |
| 5,281,851 A | 1/1994 | Mills et al. | |
| 5,367,192 A | 11/1994 | Massironi | |
| 5,696,665 A | 12/1997 | Nagy | |
| 6,432,750 B2 * | 8/2002 | Jeon et al. | 438/122 |
| 6,707,135 B2 | 3/2004 | Madrid | |
| 6,838,757 B2 | 1/2005 | Abbott et al. | |
| 2006/0113562 A1 * | 6/2006 | Jeun et al. | 257/177 |

FOREIGN PATENT DOCUMENTS

JP     06-085142    3/1994

* cited by examiner

*Primary Examiner*—Victor A Mandala
(74) *Attorney, Agent, or Firm*—Yingsheng Tung; Wade J. Brady, III; Frederick J. Telecky, Jr.

(57) ABSTRACT

An integrated circuit (IC) package that comprises a lead frame. The lead frame has a downset portion and leads. The downset portion has an exterior surface that is configured to face away from a mounting board, and an interior surface that is configured to face towards the mounting board. The leads are bent away from the exterior surface, and each of the leads have a first end coupled to an IC and a second end configured to pass through one of a plurality of mounting holes extending through the mounting board. The IC is coupled to the interior surface.

14 Claims, 10 Drawing Sheets

INTEGRATED CIRCUIT PACKAGE AND METHOD OF MANUFACTURE THEREOF

CROSS-REFERENCE TO RELATED APPLICATIONS

This application is a continuation-in-part of U.S. patent application Ser. No. 11/066,875, entitled "AN INTEGRATED CIRCUIT PACKAGE AND METHOD OF MANUFACTURE THEREOF," to Lange and Boyd, filed on Feb. 25, 2005 now abandoned, which is commonly assigned with the present invention and incorporated herein by reference as if reproduced herein in its entirety.

TECHNICAL FIELD OF THE INVENTION

The present invention is directed to integrated circuit packaging and a method for manufacturing an integrated circuit package.

BACKGROUND OF THE INVENTION

After the manufacture of integrated circuits on a semiconductor wafer there remains the need to protect the individual integrated circuit dies from damage and to provide connections to other devices. The enclosure surrounding and connections to the integrated circuit is referred to as an integrated circuit package. Numerous consumer electrical products demand integrated circuit packages that are subject to high cost constraints. As integrated circuits grow in complexity and capabilities, however, conventional integrated circuit packages have inadequate thermal management and connectivity requirements. Additionally, today's complex integrated circuits are highly susceptible to damage by mechanical stresses that can be imparted from the surface that the integrated circuit package is mounted on.

Accordingly, what is needed in the art is an integrated circuit package that allows a large number of connections to the integrated circuit, facilitate heat transfer away from the integrated circuit, and protect the integrated circuit from mechanical stresses.

SUMMARY OF THE INVENTION

One embodiment is an integrated circuit (IC) package that comprises a lead frame having a downset portion and leads. The downset portion has an exterior surface configured to face away from a mounting board, and an interior surface configured to face towards the mounting board. The leads are bent away from the exterior surface and each of the leads have a first end coupled to an IC and a second end configured to pass through one of a plurality of mounting holes extending through said mounting board. The IC is coupled to the interior surface of the downset portion.

Another embodiment is an IC package that comprises the above-described lead frame and IC adhered to the interior surface of the downset portion. The package further includes a heat sink adhered to the exterior surface of the downset portion, and a mold that encompasses the IC and the downset portion, except for the exterior surface.

Yet another embodiment is a method of manufacturing an IC package that comprises forming a lead frame. Forming the lead frame includes bending the lead frame to form the above-described downset portion and forming the above-described leads. Forming the IC package further includes bending the second end of the leads away from the exterior surface of the downset portion.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiments as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
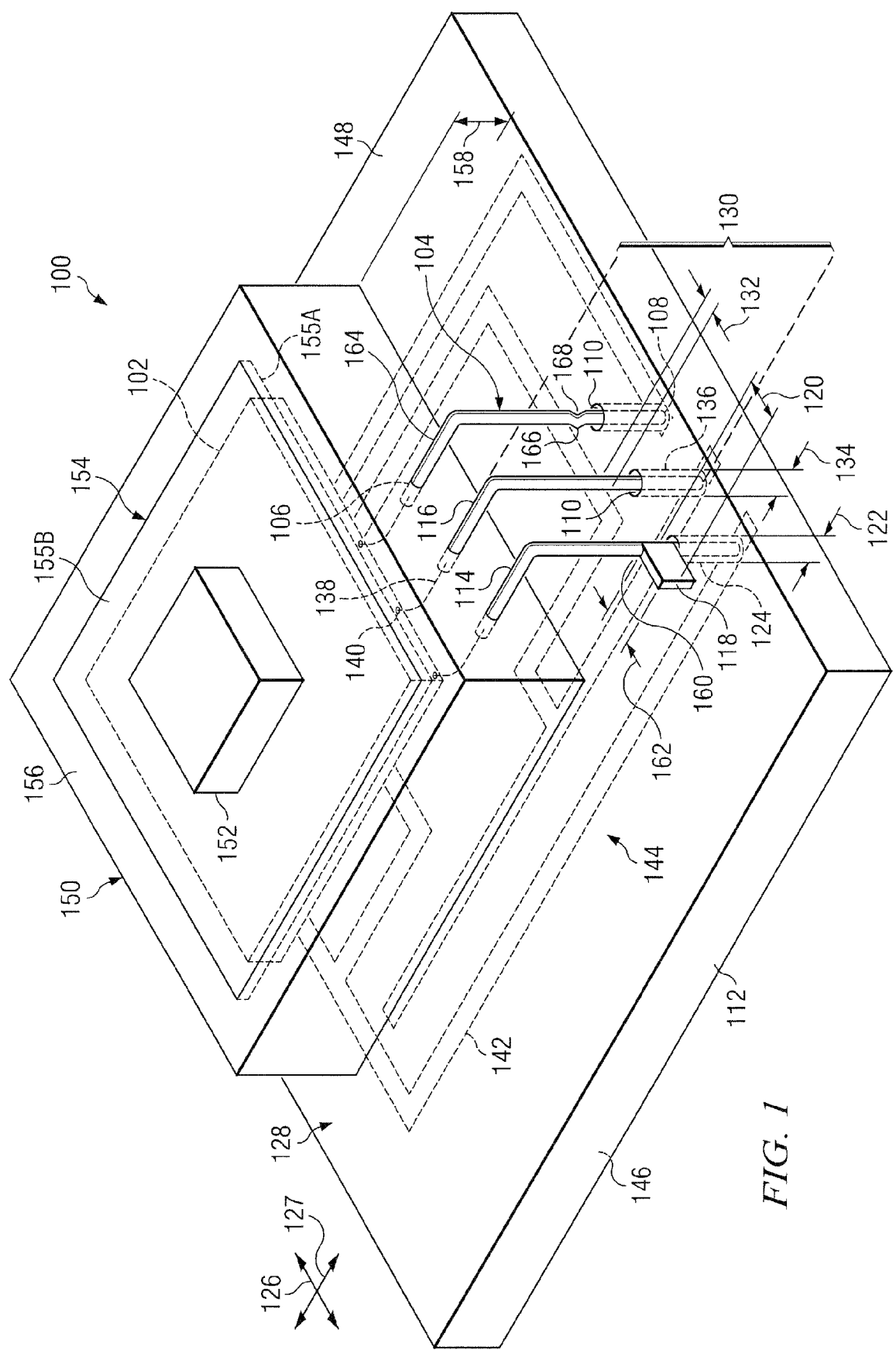
FIG. 1 illustrates a perspective view of one embodiment of an integrated circuit package of the present invention.

FIG. 1 presents a perspective view of one embodiment of the present invention, an integrated circuit package 100. The integrated circuit package 100 comprises an integrated circuit 102 and leads 104 coupled to the integrated circuit 102. The integrated circuit 102 can comprise any conventional microelectronic device, such as standard linear and logic products, digital signal processors, microprocessors, digital and analog devices, high frequency and higher power devices, and comprise either large or small chip sizes.

Each of the leads 104 have a first end 106 configured to be coupled to the integrated circuit 102 and a second end 108 configured to pass through one of a plurality of mounting holes 110 extending through a mounting board 112. The leads 104 comprise at least one positioning lead 114 and at least one non-positioning lead 116. The positioning lead 114 comprises a stop 118. The stop 118 is a continuous part of the positioning lead 114 and has a lateral dimension 120 that is greater than a diameter 122 of a first hole 124 of the plurality of mounting holes 110. The term lateral dimension 120 as used herein refers to any number of directions 126, 127 that is parallel with a plane 128 of the mounting board 112. The non-positioning lead 116 has a continuous uniformly shaped body 130 with a lateral dimension 132 less than a diameter 134 of a second hole 136 of the plurality of mounting holes 110. The stop 118 limits an extension of the non-positioning lead 116 through the second hole 136.

The first ends 106 of the leads 104 can be configured for direct or indirect coupling to the integrated circuit 102. For the embodiment shown in FIG. 1, bonding wires 138 facilitate the indirect coupling of the first ends 106 of the leads 104 to bond pads 140 on the integrated circuit 102. Of course, direct coupling by placing the first ends 106 in contact with the bond pads 140 is also within the scope of the present invention. Similarly, the second ends 108 of the leads 104 can be coupled directly or indirectly to metal lines 142 of a printed circuit 144. For instance, as shown in FIG. 1, the second ends 108 of both the positioning lead 114 and non-positioning lead 116 are directly coupled via solder to the metal lines 142 of the printed circuit 144. For the embodiment shown in FIG. 1, the metal lines 142 are patterned on a bottom side 146 of the mounting board 112, whereas the integrated circuit package 100 is surface mounted on a topside 148 of the mounting board 112

With continuing reference to FIG. 1, the integrated circuit package 100 can further comprise a mold 150, a heat sink 152 and a mounting pad 154. In preferred embodiments, the integrated circuit 102 is coupled to an interior surface 155A of the mounting pad 154 using an adhesive such as epoxy. The mold 150, which can also be made of an epoxy, encompasses the integrated circuit 102 and pad 154, except for an exterior surface 155B of the pad 154, to which the heat sink 152 is preferably coupled to. In addition to protecting the integrated circuit 102 against harmful environmental conditions, the mold 150 securely holds the leads 104, bonding wire 138 and heat sink 152 at appropriate locations relative to the integrated circuit 102. For instance, the first end 106 of the leads 104 is encompassed by the mold 150.

In some preferred embodiments, such as shown in FIG. 1, the heat sink 152 is above a top surface 156 the mold 150. Locating the heat sink 152 over the integrated circuit 102 and pad 154 is advantageous in embodiments where the integrated circuit package 100 is held above the plane 128 of the mounting board 112 and the heat sink 152 does not contact the mounting board 112. In these cases, there is greater dissipation of heat generated from the active integrated circuit 102 as compared to a heat sink that is under the integrated circuit 102.

The stop 118 of the positioning lead 114 is configured to hold the integrated circuit package 100 above the plane 128 of the mounting board 112 by a fixed distance 158, for example, about 100 microns to about 2000 microns. Holding the integrated circuit package 100 above the plane 128 of the mounting board 112 advantageously protects the integrated circuit 102 against damage from mechanical stresses that can otherwise be imparted from the mounting board 112 to the integrated circuit package 100. Preferably, the stop 118 is configured to prevent a segment 160 of the positioning lead 114 from passing through the first hole 124. As illustrated in FIG. 1, the segment 160 is between the first end 106 and the stop 118.

The stop can be configured to have a number of different shapes to provide the lateral dimension greater than the diameter of its corresponding mounting hole. For example, as illustrated in FIG. 1, the stop 118 of the positioning lead 114 comprises an increased width 162 in one direction 126. In some preferred embodiments, the increase width 162 is at least about 5 percent greater than the diameter 122 of the first hole 124. Of course, other configurations where the increased width is in a different direction 127, or several directions that are parallel to the plane of the mounting board 112, are also within the scope of the present invention.

As another example, the positioning lead can have a stop that comprises a bend in the positioning lead. For instances, FIG. 1 shows a second positioning lead 164 having a stop 166 that comprises a bend in the second positioning lead 164. In some preferred embodiments, the stop 166 has an interior angle 168 ranging from about 70 to about 110 degrees, although other ranges of angles and type types of bends can be used. Of course, positioning lead having stops that comprise multiple bends, or both and increased width and a bend are also within the scope of the present invention.

Figure 2:
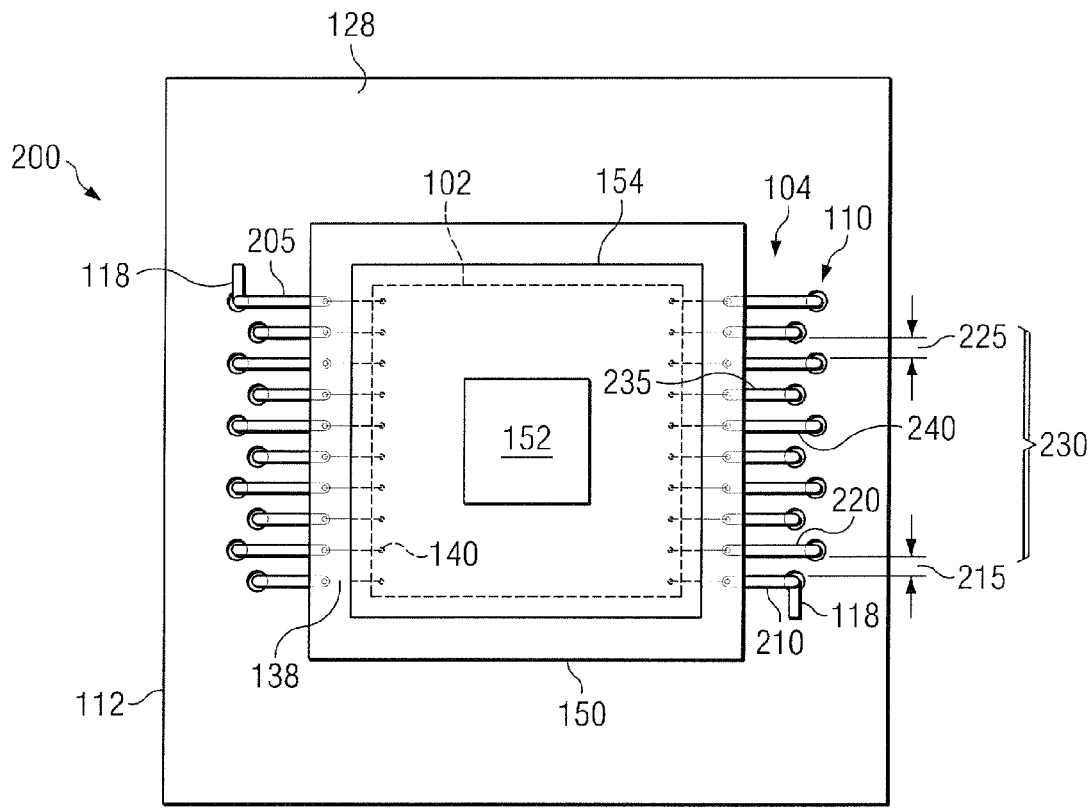
FIG. 2 presents a plan view of exemplary integrated circuit package of the present invention.

With continuing reference to FIG. 1, to present additional aspects of the present invention, FIG. 2 presents a plan view of exemplary integrated circuit package 200. The same reference numbers used in FIG. 1 are used to label analogous components of the integrated circuit package 200. For clarity, the leads 104 and mold 150 are depicted as being semitransparent and transparent, respectively.

As shown in FIG. 2, to hold the integrated circuit package 200 above the plane 128 of the mounting board 112, it is preferable to have at least two positioning leads 205, 210. In some cases, such as shown in FIG. 1, the positioning leads 114, 164 are coupled to the same side of the integrated circuit 102. It is more preferable, however, for the two positioning leads 205, 210 to be coupled to opposing sides of the integrated circuit 102, as shown in FIG. 2. Locating the positioning leads 205, 210 on opposing sides of the integrated circuit 102 more stably holds the integrated circuit package 100 at the fixed distance 158, as compared to having positioning leads on only one side of the integrated circuit 102. Configuring the two positioning leads 205, 210 as corner leads, such as shown in FIG. 2, is even more desirable, as this configuration further stabilizes the seating of the integrated circuit package 200 on the mounting board 112. Additional stability can be gain by locating the corner positioning leads 205, 210 in opposing diagonal corners of the integrated circuit 102, such as shown in FIG. 2.

In some instances, configuring the positioning leads 205, 210 as corner leads provides the additional benefit of reducing the pitch 215 between the corner positioning lead 210 and an adjacent interior non-positioning lead 220. Reducing the pitch 215 between the corner positioning lead 210 and the adjacent interior non-positioning lead 220 is facilitated by locating the stop 118 on a side of the positioning lead 210 that is non-proximal to the adjacent non-positioning lead 220, as shown in FIG. 2.

Corner positioning leads 205, 210 can be advantageously used in combination with a variety of surface mounting configurations to reduce the interior lead pitch 225 and thereby increase the number of connections to the integrated circuit 102. For instance, as shown in FIG. 2, the interior non-positioning leads 230 are extended through mounting holes 110 that are arranged in a staggered configuration. In some cases, to facilitate extension of leads 104 through the staggered mounting holes 110, shorter non-positioning leads 235 are interleaved with longer non-positioning leads 240 on the same side of the integrated circuit 102. Of course, short and long positioning leads 205, 210 can also be used in a staggered hole configuration.

Figure 3:
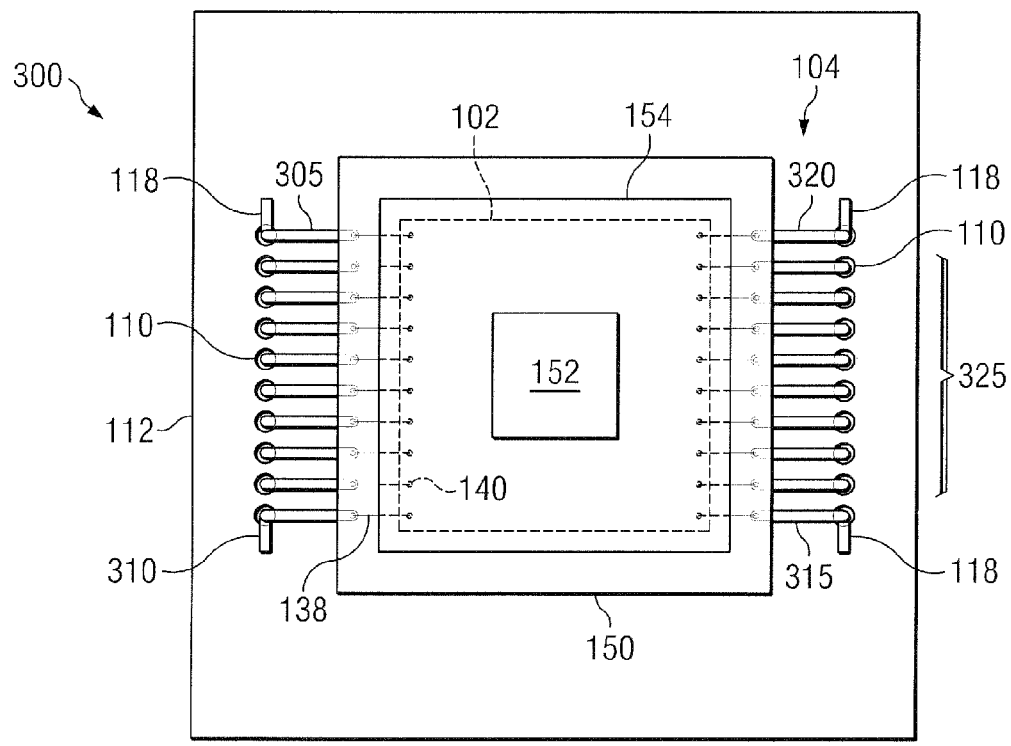
FIG. 3 presents a plan view of another embodiment of the integrated circuit package of the present invention.

With continuing reference to FIG. 1, FIG. 3 presents a plan view of another embodiment of the integrated circuit package 300 of the present invention. Again, the same reference numbers as used in FIG. 1 are used to label analogous components of the integrated circuit package 300. FIG. 3 presents a preferred embodiment of the integrated circuit package comprising at least four positioning leads 305, 310, 315, 320. Preferably, the positioning leads 305, 310, 315, 320 are corner leads, where each one of the positioning leads 305, 310, 315, 320 are coupled to different corners of the integrated circuit 102. FIG. 3 illustrates the positioning leads 305, 310, 315, 320 and non-positioning leads 325 being extended, below the plane of view, through mounting holes 110 that are arranged in a straight-line configuration. Of course, a staggered arrangement of mounting holes 110, similar to that presented in FIG. 2 could also be used.

For clarity, only a limited number of leads 104 are depicted in the embodiments of the integrated circuit packages illustrated in FIGS. 1-3. It should be understood, however, that the integrated circuit package of the present invention could contain any number of leads found in a conventional surface-mount integrated circuit packages. For instance, integrated circuit packages having from two to three hundred leads are known in the industry. Also, the integrated circuit package can be any number of conventional type of lead-containing package, including plastic dual in-line integrated circuit packages (PDIP), small outline integrated circuits (SOICs), quad flat packages (QFPs), thin QFPs (TQFPs), Small Shrink Outline Plastic packages (SSOP), thin SSOPs (TSSOPs), thin very small-outline packages (TVSOPs), or other packages known to those skilled in the art. The leads can be made of any conventional ductile conductive material used for through-hole leads. Non-limiting examples of such materials include gold, silver, copper and alloys thereof. In some cases, the leads are plated with tin, nickel, palladium or similar materials to improved adhesion to solder.

Another aspect of the present invention is a method of manufacturing an integrated circuit package. The method of manufacturing an integrated circuit package can be used to produce any of the embodiments of the integrated circuit package presented in FIGS. 1-3 and discussed above.

Figure 4:
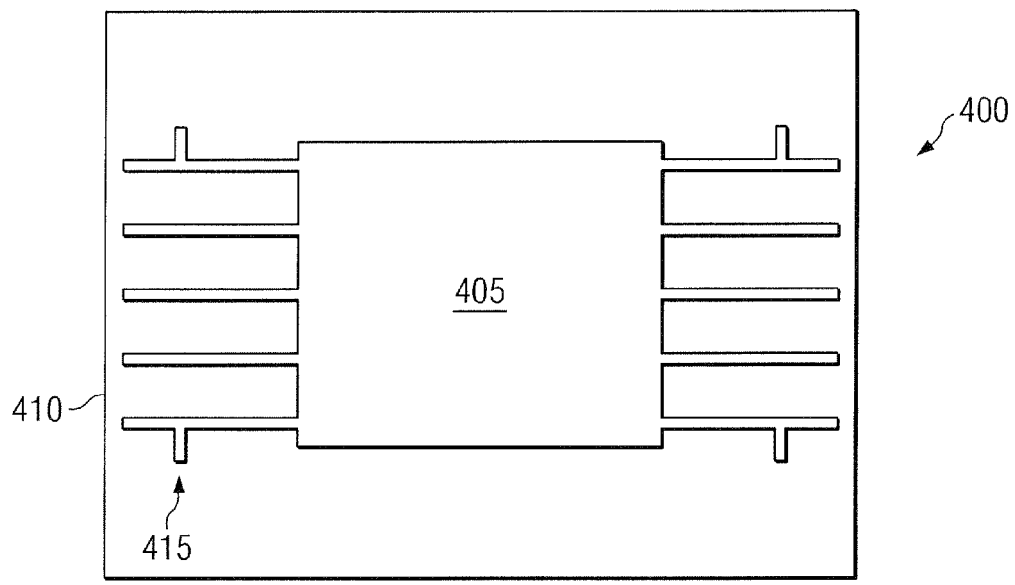
FIGS. 4-8 illustrate plan views of selected steps in an exemplary method of manufacturing an integrated circuit package following the principles of the present invention.

FIGS. 4-8 illustrate plan views of selected steps in an exemplary method of manufacturing an integrated circuit package 400 following the principles of the present invention. Turning first to FIG. 4, presented is a plan view of a partially completed integrated circuit package 400 after forming a layout pattern 405 on a metal sheet 410. Any conventional process, such as photolithography can be used to define the layout pattern 405 on the metal sheet 410. The layout pattern 405 comprises a lead layout pattern 415 for at least one positioning lead having a stop.

Figure 5:
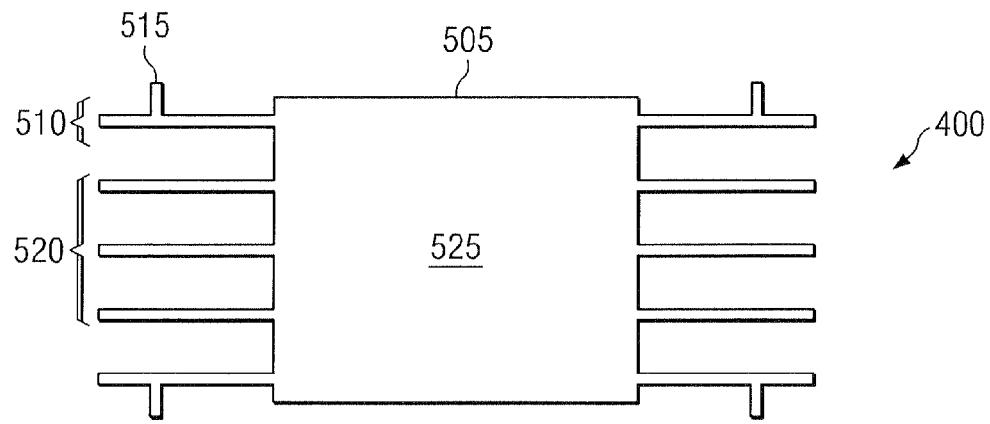

With continuing reference to FIG. 4, FIG. 5 shows the partially completed integrated circuit package 400 after removing portions of the metal sheet 410 that are outside of the layout pattern 405 to thereby form a lead frame 505 comprising at least one positioning lead segment 510 having a stop 515. As illustrated in FIG. 5, the stop 515 is configured to be a continuous part of the positioning lead segment 510. Any conventional method, such as stamping or etching, can be used to form the leads frame 505 out of the sheet of metal 410. The lead frame 505 further comprises a one or more non-positioning lead segments 520 and pad 525 configured to accommodate an integrated circuit. Although not shown for the sake of clarity, one of ordinary skill in the art would understand that the lead frame 505 can also include other conventional components, such as shorting bars, dam bars, etc . . . , to facilitate forming the integrated circuit package 400.

Figure 6:
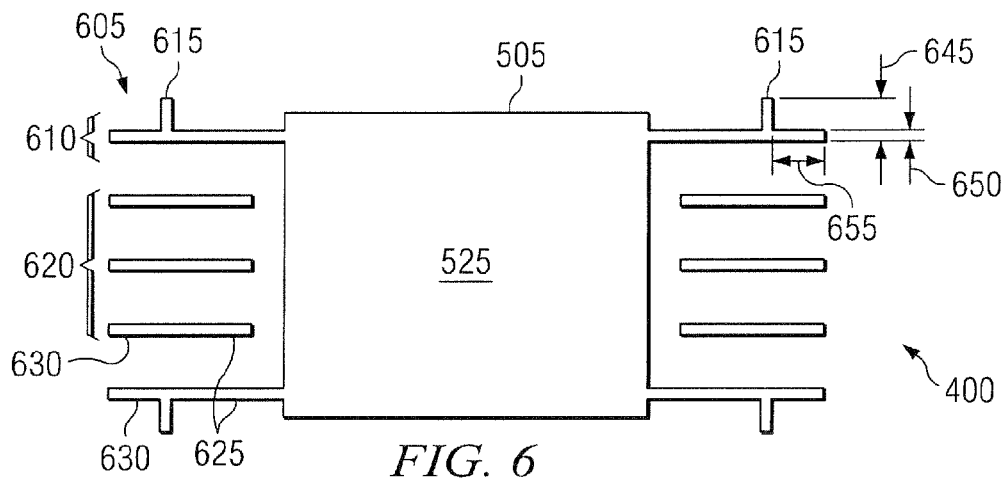

With continuing reference to FIGS. 4-5, FIG. 6 presents the integrated circuit package 400 after removing portions of the lead frame 505 to thereby form a plurality of leads 605 comprising positioning leads 610 having a stop 615 and non-positioning leads 620. Any conventional device such as a trimmer tool can be used to remove the undesired portions of the lead frame. Each of the leads 605 has a first end 625 and a second end 630.

Figure 7:
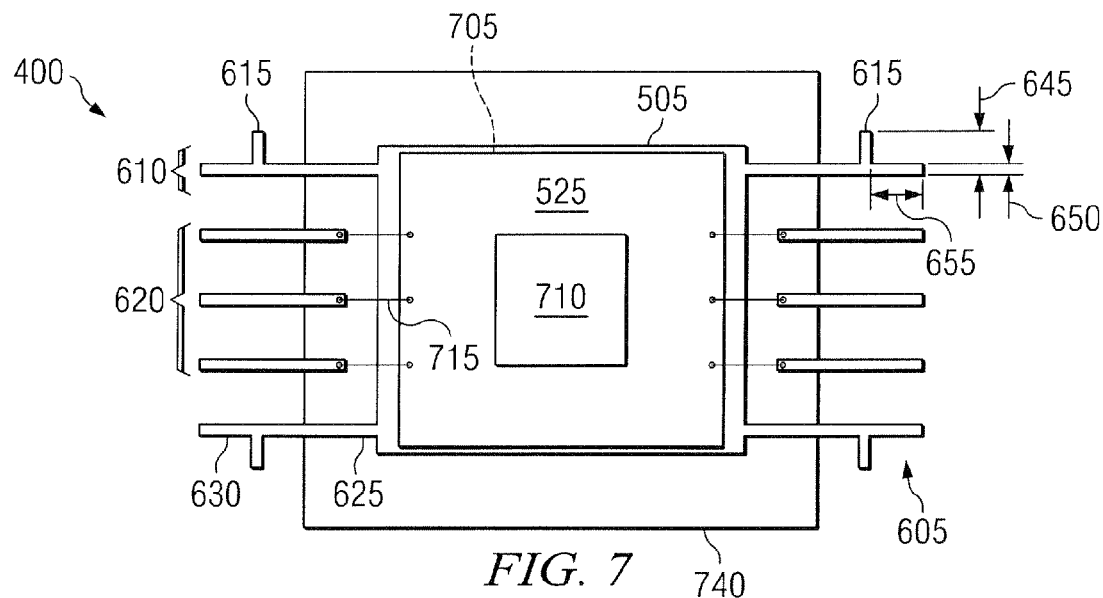
Figure 8:
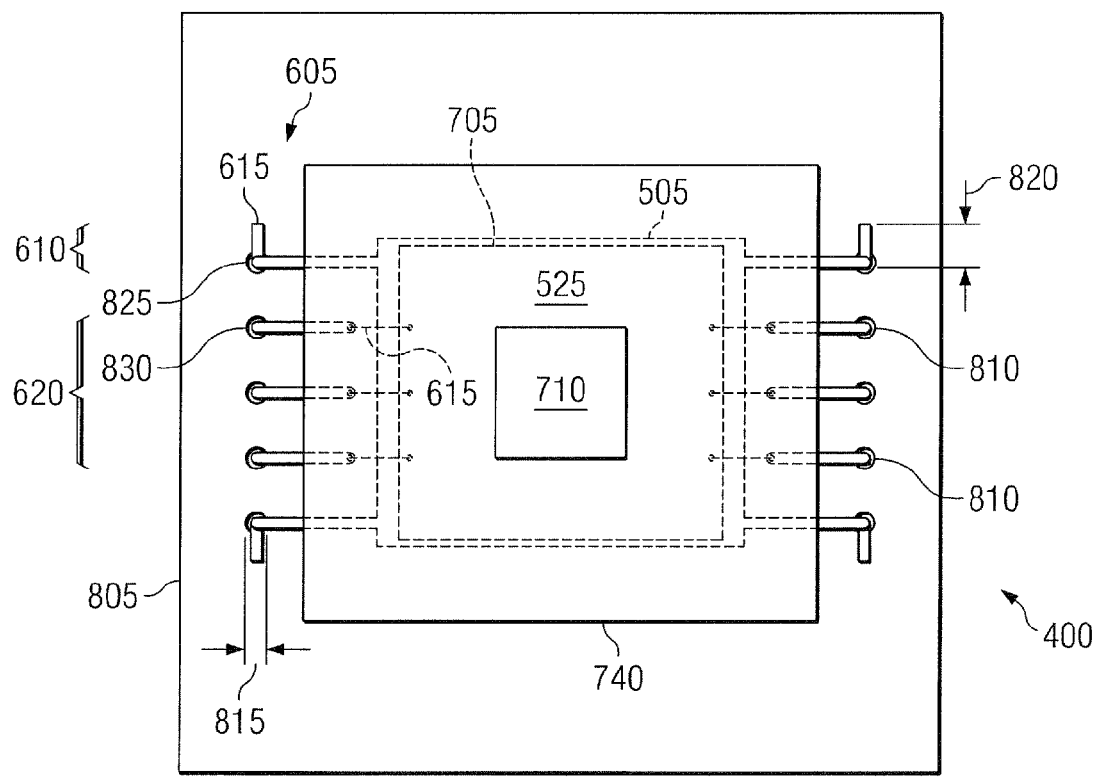

With continuing reference to FIGS. 4-6, FIG. 7 show the partially completed integrated circuit package 400 after coupling an integrated circuit 705 to one side of the pad 525 (e.g., the underside of the pad 525 as shown in FIG. 7), coupling a heat sink 710 to the other side of the pad 525, and coupling the positioning lead segments 610 and non-positioning lead segments 620 to the integrated circuit 705. Similar to that discussed above in the context of FIG. 1, the first end 625 of each lead 605 can be coupled to the integrated circuit 705 via bonding wires 715.

FIG. 7 also illustrates the partially completed integrated circuit package 400 after enclosing the integrated circuit 705 in a mold 740. For clarity, a transparent view through the mold 740 is presented. Preferably, the mold 740 also encloses the first end 625 of the each of leads 605. As shown in FIG. 7, in some cases it is advantageous for one or more of the positioning leads 610 to be left attached to the lead frame 505 shown in FIG. 5, while the non-positioning leads 620 are isolated from the lead frame 505. In such instances, the positioning lead segment 510 and positioning lead 610 are substantially the same structures. of course, any combination of leads 605 that are each attached or isolated from the lead frame 505 is also within the scope of the present invention.

With continuing reference to FIGS. 4-7, FIG. 8 shows the completed integrated circuit package 400 after bending the leads 605, below the plane of view, and mounting the integrated circuit package to a mounting board 805 having a plurality of mounting holes 810. Any conventional device such as a bending tool can be used to bend the leads 605. The leads 605 are bent below the plane of view to configure the second ends of the leads 630 shown in FIG. 7 to pass through the mounting holes 810 and thereby extend the second ends 630 through the mounting board 805. Preferably, the positioning lead 610 is bent to configure the stop 615 to be below a bottom surface of the mold 740. In some preferred embodiments, the plurality of mounting holes 810 all have substantially a same diameter 815, although embodiments with differently-sized mounting holes are also within the scope of the present invention.

The stop 615 of the positioning leads 610 is configured to have a lateral dimension 820 greater than the diameter 815 of a first hole 825. The stop 615 thereby limits an extension of at least one non-positioning lead 620 through a second hole 830 of the mounting holes 810. Moreover, because the stop 615 is a continuous part of the positioning lead 610, the stop 615 is less prone to deform, break or shear off while the integrated circuit package is being mounted or in use, as compared to a stop that is mechanically attached or bonded to the positioning lead 610. Returning to FIG. 6, the stop 615 of the positioning lead 610 is also configured to have a width 645 greater than a width 650 that of an adjacent portion 655 of the positioning lead. The adjacent portion 655 is configured to pass through the first hole 825 shown in FIG. 8.

For the embodiment presented in FIGS. 4-8, the properties of the positioning lead 610 requires that the method include the preparation of a layout pattern 405, shown in FIG. 4, to have a special lead layout pattern 415 for the positioning lead to define a stop. In other embodiments of the method, however, the layout pattern does not have a special lead layout pattern.

Figure 9:
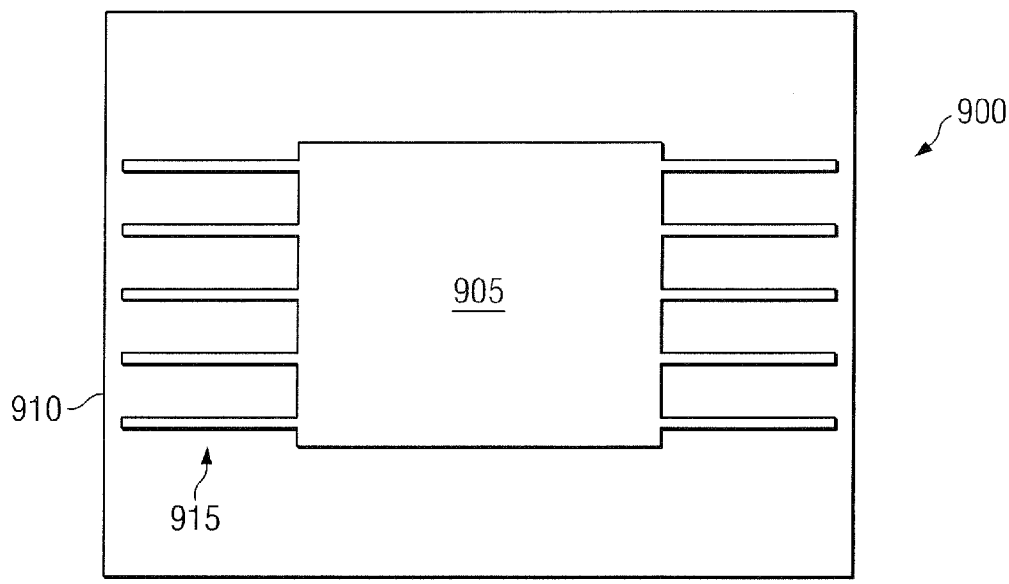
FIGS. 9-13 illustrate plan views of selected steps in an alternative method of manufacturing an integrated circuit package of the present invention.

Such an embodiment is illustrated in FIGS. 9-13, which present plan views of selected steps for an alternative exemplary method of manufacturing an integrated circuit package 900 according to the present invention. Turning first to FIG. 9, illustrated is a plan view of a partially completed integrated circuit package 900 after forming a layout pattern 905 on a metal sheet 910. The layout pattern 905 comprises a lead layout pattern 915 for a plurality of uniformly shaped leads. Unlike the embodiment presented in FIGS. 4-8, however, there is no special pattern for a positioning lead having a stop.

Figure 10:
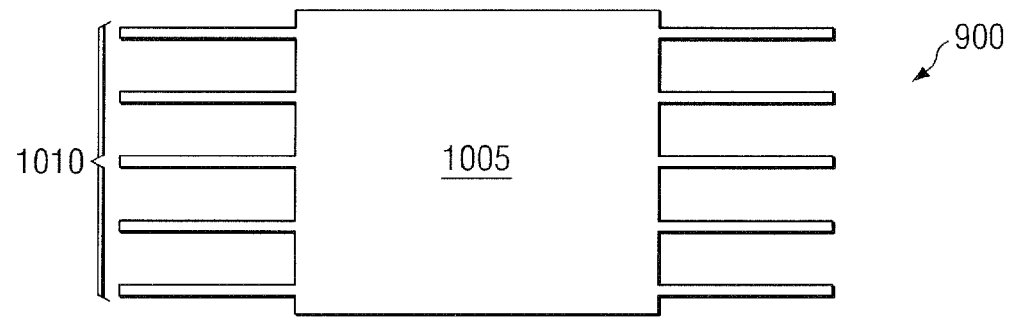

With continuing reference to FIG. 9, as illustrated in FIG. 10, portions of the metal sheet 910 outside of the layout pattern 905 can be removed, using the same procedures as discussed in the context of FIG. 5, to provide a lead frame 1005. The lead frame 1005 comprises lead segments 1010 that are uniformly shaped.

Figure 11:
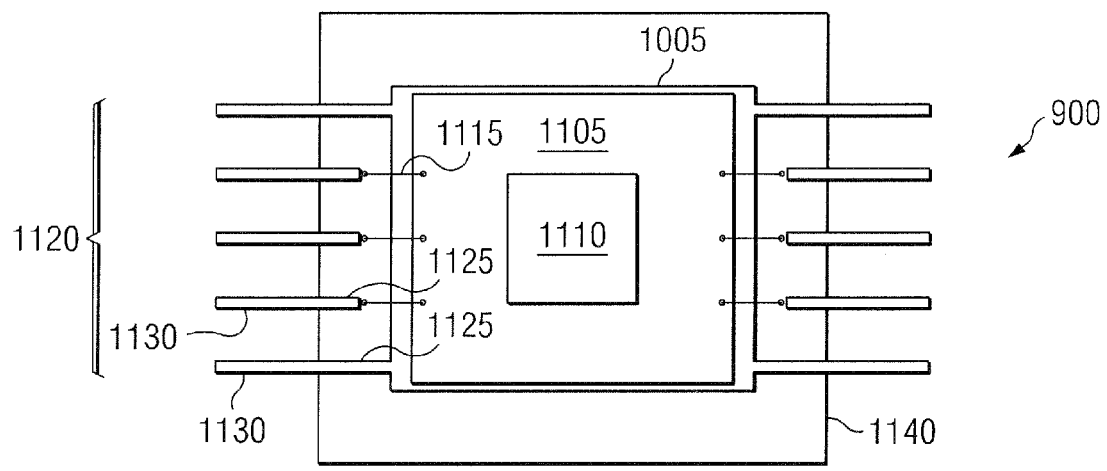

While maintaining reference to FIG. 9-10, FIG. 11 shows the partially completed integrated circuit package 900 after adding an integrated circuit 1105, heat sink 1110, and bonding wiring 1115 to the integrated circuit package 900 using the same procedures as discussed in the context of FIG. 6. Similarly, portions of the lead frame 1005 can be removed to form a plurality of uniformly-shaped leads 1120 having first and second ends 1125, 1130, and a mold 1140 applied to enclose the integrated circuit 1105, using the same procedures discussed in the context of FIG. 7. As illustrated in FIG. 11, however, all of the leads 1120 at this stage in the manufacturing process are substantially identical and uniformly shaped.

With continuing reference to FIG. 9-11, FIG. 12 shows the partially completed integrated circuit package 900 after forming at least one positioning lead 1210 by bending at least one of the uniformly-shaped leads 1120 shown in FIG. 11 to form a stop 1215. In this embodiment, the stop 1215 is a bend in the positioning lead 1210. Leads 1120 that are not bent in this fashion are non-positioning leads 1220. As noted above, configuring the stop 1215 as a continuous part of the positioning lead 1210, makes the stop 1215 resistant to deformation, breaking or shearing off while the integrated circuit package 900 is being mounted or in use.

Figure 12:
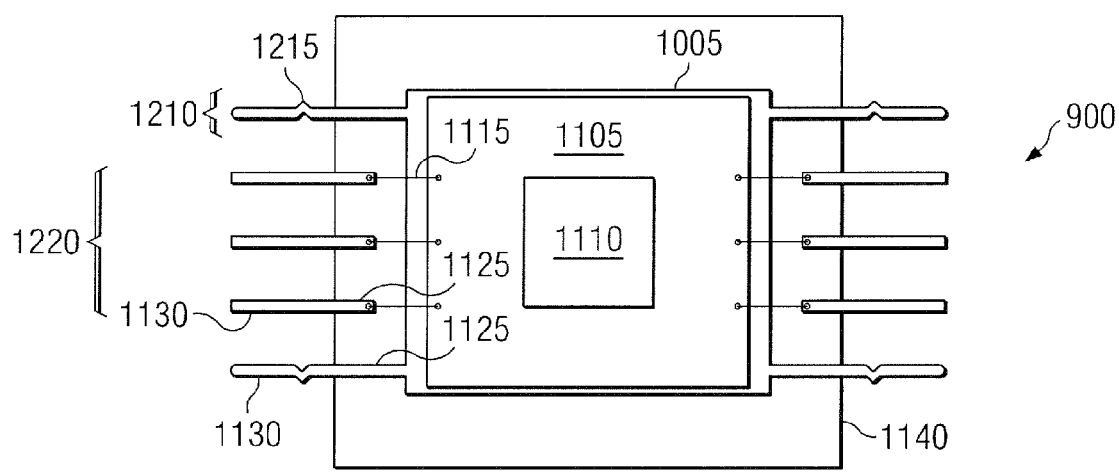
Figure 13:
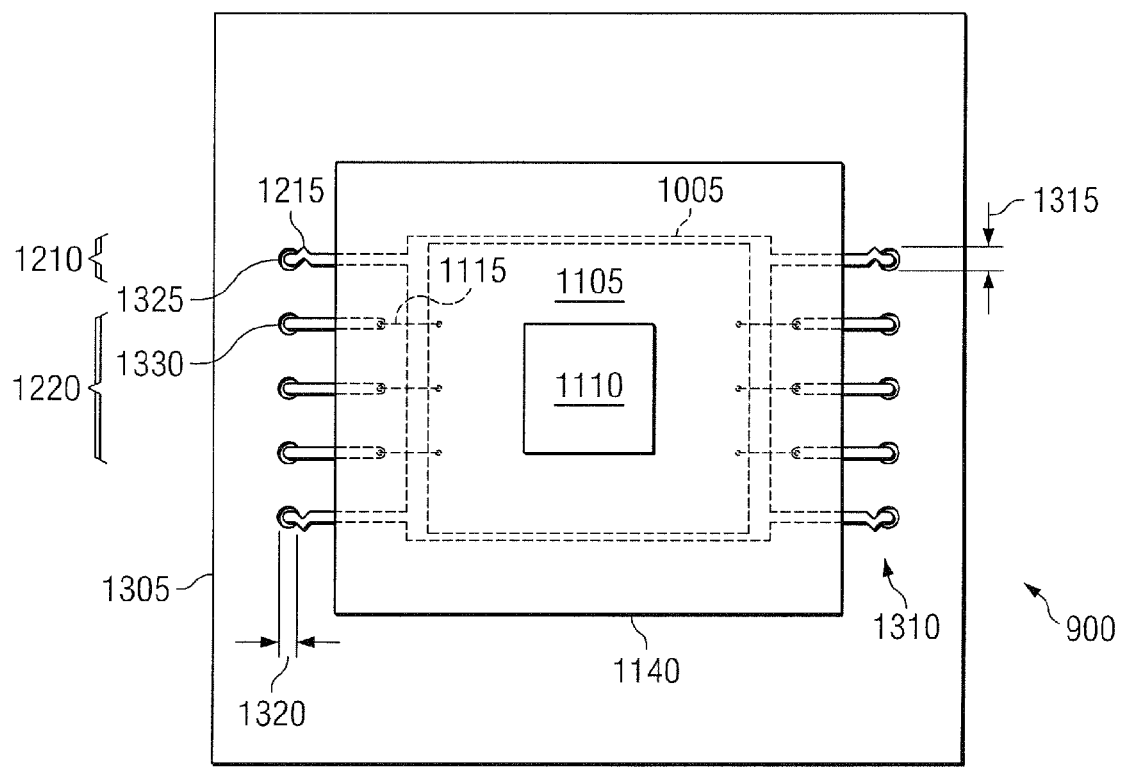

While still referring to FIG. 9-12, FIG. 13 shows the integrated circuit package 900, after additional bending of the positioning leads 1210, and for the first time, bending of the non-positioning leads 1220, to situate their second ends 1130, shown in FIG. 12, below the plane of view. The integrated circuit package 900 is shown after coupling to a mounting board 1305, having a plurality of holes 1310. Similar to previously discussed embodiments, the stop 1215 of the positioning lead 1210 is configured to have a lateral dimension 1315 that greater than a diameter 1320 of a first hole 1325. The stop 1215 thereby limits an extension of one or more non-positioning leads 1220 through a second hole 1330.

For clarity, the manufacture of the integrated circuit packages shown in FIGS. 4-8 and 9-13 are shown as separate process flows. However, one skilled in the art would recognize that these processes could be combined into a single process flow, if desired.

Figure 14:
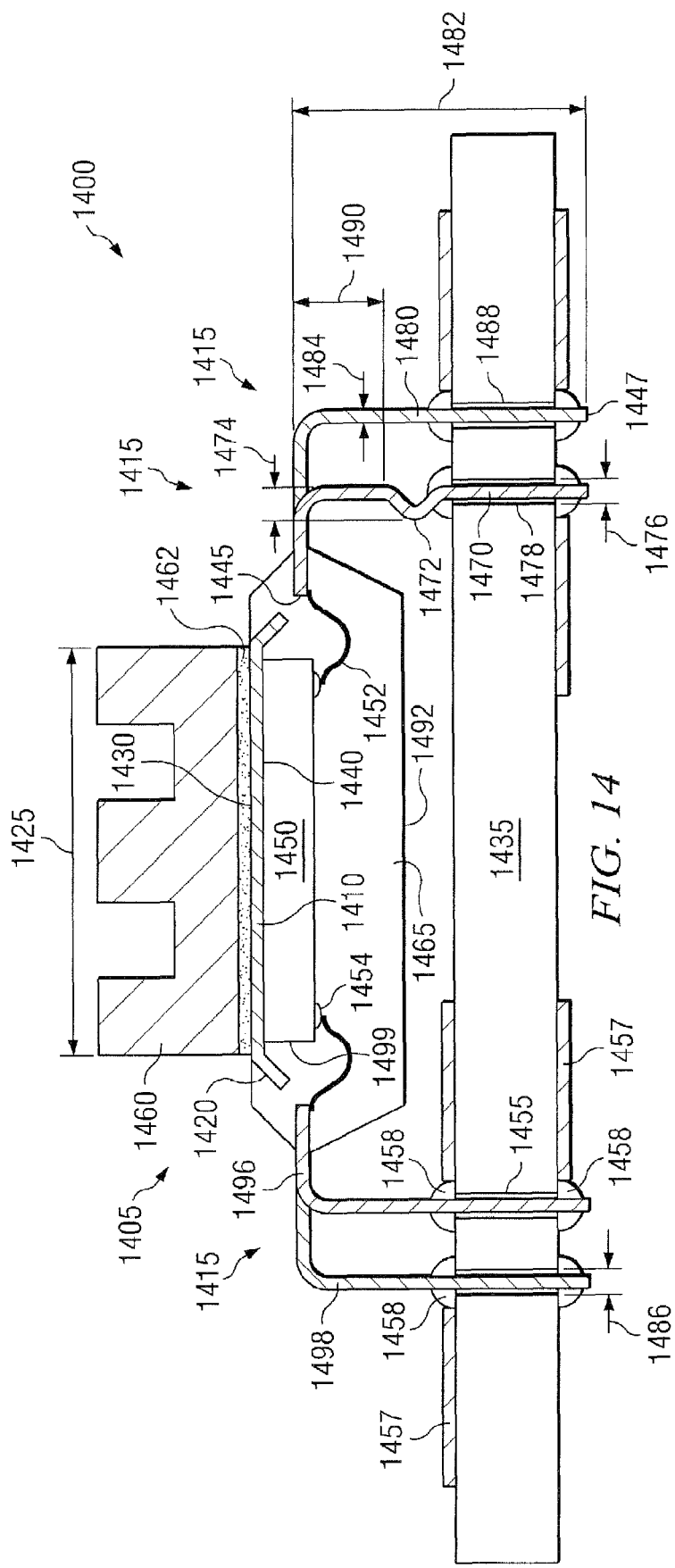
FIG. 14 presents a cross-sectional view of another example embodiment of the integrated circuit package of the present invention.

FIG. 14 presents a cross-sectional view of another example embodiment of an integrated circuit package 1400. The integrated circuit package 1400 comprises a lead frame 1405 having a downset portion 1410 and leads 1415. The term downset portion 1410 as used herein refers to that portion of the lead frame 1405 that has been bent to provide sides 1420 that are below a horizontal plane 1425 of the lead frame 1405. The downset portion 1410 has an exterior surface 1430 that is configured to face away from a mounting board 1435, and an interior surface 1440 that is configured to face towards the mounting board 1435.

The leads 1415 are bent away from the exterior surface 1430. Each of the leads 1415 has a first end 1445 and a second end 1447. The first end 1445 is coupled to an IC 1450 that, in turn, is coupled to the interior surface 1440 of the downset portion 1410. As discussed above in the context of FIG. 1, bonding wires 1452 can indirectly couple the first ends 1445 to bond pads 1454 on the IC 1450, although direct coupling is also within the scope of the present invention. The second end 1447 is configured to pass through one of a plurality of mounting holes 1455 extending through the mounting board 1435. Similar to that discussed in the context of FIG. 1, the second ends 1447 can be coupled directly or indirectly to metal lines 1457 by solder connections 1458. The mounting board 1435 can be a single-sided, double-sided or multilayered mounting board.

In some embodiments, the exterior surface 1430 of the downset portion 1410 of the lead frame 1405 serves as a heat-dissipating surface to remove heat generated by the IC 1450. In other cases, the package 1400 further includes a heat sink 1460 coupled to the exterior surface 1430 of the lead frame 1405. Any conventional means can be used to couple the heat sink 1460 to the exterior surface 1430, e.g., the heat sink 1460 can be adhered to the exterior surface 1430 using an adhesive 1462 such as epoxy. The IC 1450 can be similarly adhered to the interior surface 1440 of the downset portion 1410.

The package 1400 can further include a mold 1465 that encompasses the IC 1450 and the downset portion 1410, except for the exterior surface 1430. Covering the exterior surface 1430 with the mold 1465 is undesirable because this could interfere with the removal of heat from the package 1400.

The leads 1415 can comprise any of the embodiments of positioning and non-positioning leads as described above in the context of FIGS. 1-13. E.g., the leads 1415 can comprise one or more positioning lead 1470 comprising a stop 1472 (e.g., a bend in the positioning lead 1470) being a continuous part of the positioning lead 1470 and having a lateral dimension 1474 greater than a diameter 1476 of a first hole 1478 of the plurality of mounting holes 1455. The leads 1415 can also comprise one or more non-positioning lead 1480 without the stop and having a continuous uniformly shaped body 1482 with a lateral dimension 1484 less than a diameter 1486 of a second hole 1488 of the plurality of mounting holes 1455, such that the stop 1472 limits an extension of the non-positioning lead 1480 through the second hole 1488.

E.g., the stop 1472 can be configured to prevent a segment 1490 of the positioning or non-positioning leads 1470, 1480 from passing through the first and second holes 1478, 1488, the segment 1490 being between the first end 1445 and the stop 1472. In some cases, the first end 1445 is encompassed by the mold 1465 and at least a portion of the stop 1472, is below a bottom surface 1492 of the mold 1465. The stop 1472 can thereby be configured to hold the bottom surface 1492 above the mounting board 1435. The leads 1415 can comprise short non-positioning leads 1496 interleaved with long non-positioning leads 1498, both the short and long non-positioning leads 1496, 1498 being coupled to a same side 1499 of the IC 1450.

Figure 15:
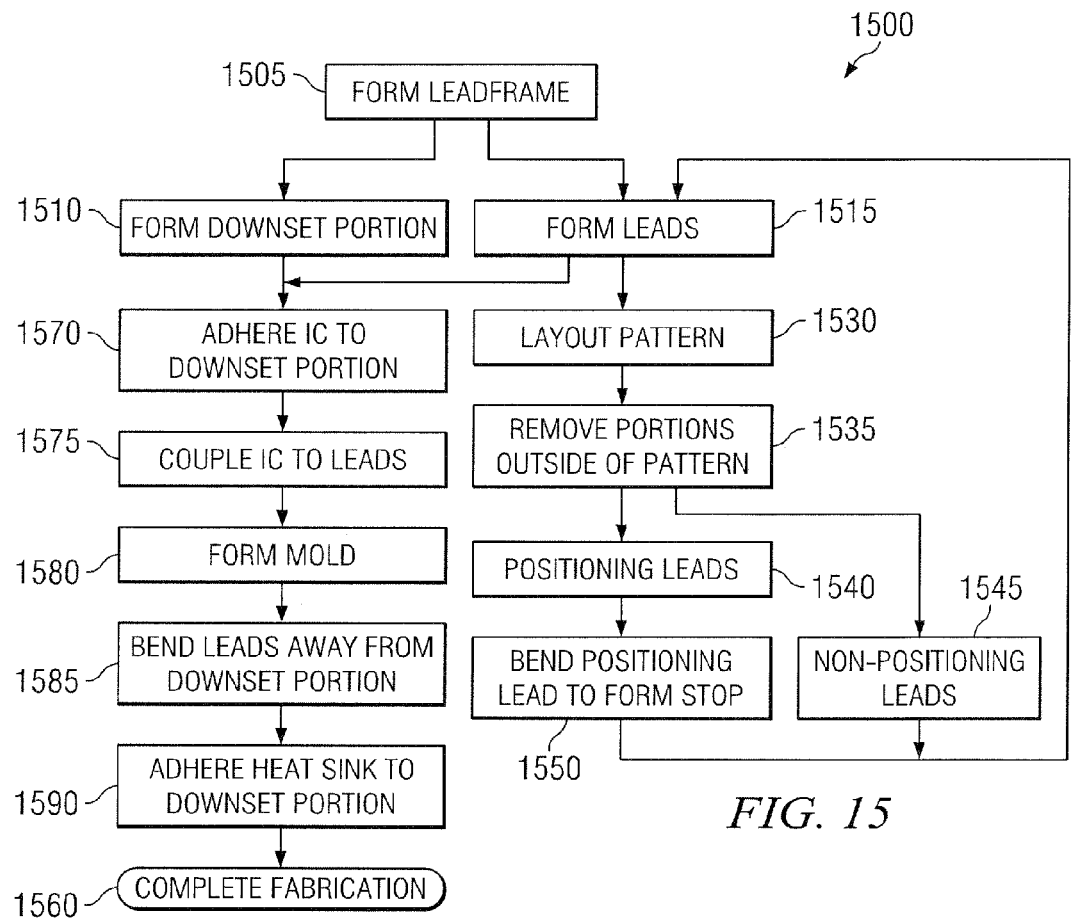
FIG. 15 presents a flow diagram of an example method of manufacturing an integrated circuit package of the invention.

FIG. 15 presents a flow diagram of an example method 1500 of manufacturing an integrated circuit package of the invention. The method 1500 comprises forming a lead frame (step 1505). The lead frame can comprise any of the materials and processes used to for the lead frames discussed in the context of FIGS. 4-13 above. Forming the lead frame 1505 can include a step 1510 of bending the lead frame to form a downset portion. As discussed in the context of FIG. 14, the downset portion has an exterior surface configured to face away from a mounting board, and an interior surface configured to face towards the mounting board. Forming the lead frame 1505 can further include a step 1515 of forming leads of the lead frame.

Forming the leads in step 1515 can further include forming one or more positioning lead with a stop (step 1540) and forming one or more non-positioning lead without the stop (step 1545). Forming the positioning or non-positioning leads can comprise a step 1530 of forming a lead layout pattern on a metal sheet, where the pattern includes a lead layout pattern for the positioning or non-positioning leads, or both. In a step 1535 portions of the metal sheet that are outside of the layout pattern are removed to form the lead frame comprising positioning or non-positioning leads, and in some cases, at least one positioning lead and at least one non-positioning lead. Forming the stop of a positioning lead can include a step 1550 of bending a uniformly-shaped leads, such the stop has an interior angle such as described in the context of FIG. 1

As further illustrated in FIG. 15, the method 1500 can include various additional steps to complete the fabrication of the package (stop step 1560). In step 1570, an IC can be adhered to the interior surface of the downset portion. In step 1575 the IC is coupled to the leads by e.g., forming bonding wires between the IC and the leads. In still another step 1580, a mold is formed to encompass the IC and the downset portion, except for its exterior surface. As also discussed in the context of FIG. 14, each of the leads have a first end coupled to an IC and a second end configured to pass through one of a plurality of holes extending through a mounting board. Preferably, the first ends of the leads are encompassed by the mold and at least a portion of the stop is below a bottom surface of the mold. In step 1585, the second end of the leads are bent away from the exterior surface of the downset portion. Preferably, the mold holds in place the IC, downset portion, bonding wire and first ends of the leads while the second end of the leads are bent. In step 1590, a heat sink can be adhered to the exterior surface of the downset portion.

To further illustrate aspects of the steps in FIG. 15, FIGS. 16-21 present cross-sectional views of selected steps in an example method of manufacturing an integrated circuit package 1600.

Figure 16:
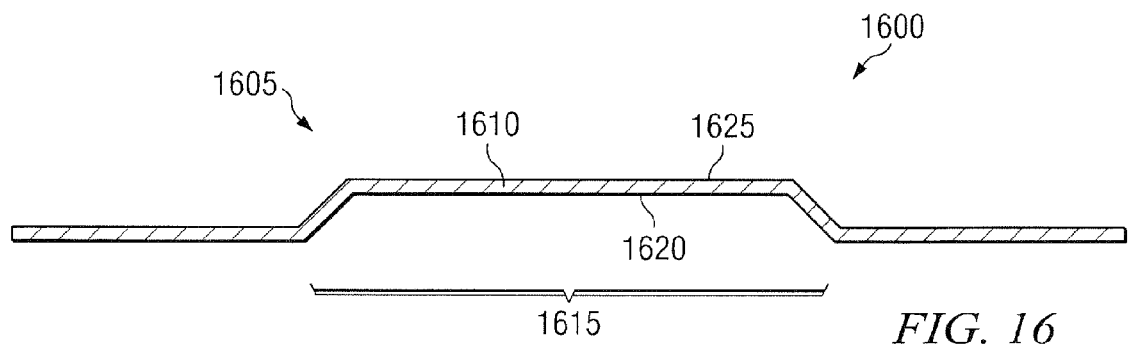
FIGS. 16-21 present cross-sectional views of selected steps in an example method of manufacturing an integrated circuit package following the principles of the present invention.
Figure 17:
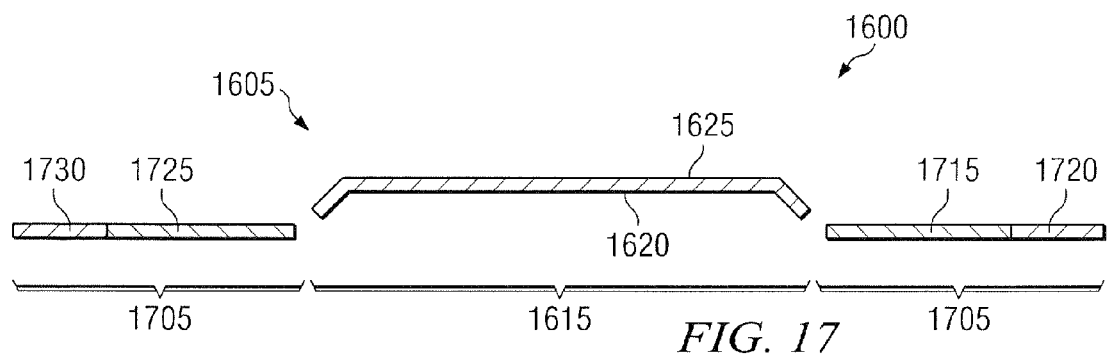
Figure 18:
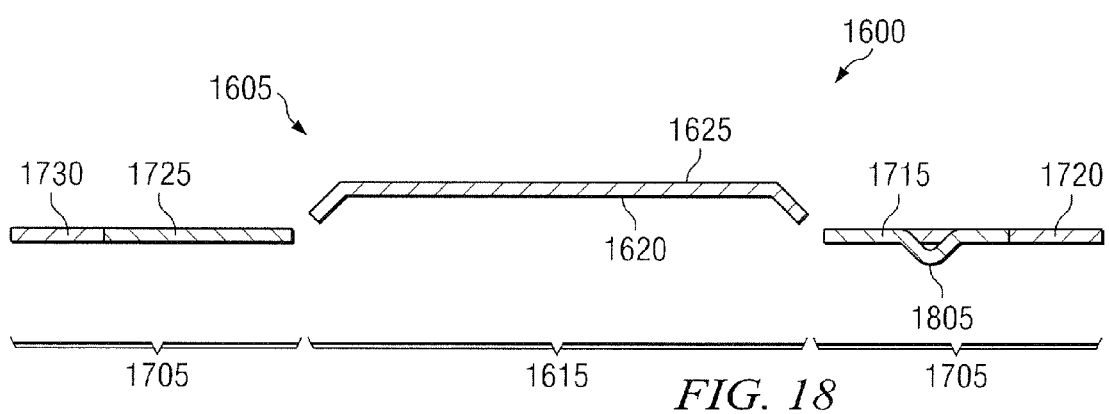

FIGS. 16-18 shows selected steps in forming a lead frame 1605 of the package 1600 in accordance with step 1505. FIG. 16 shows the package 1600 after providing a metal sheet 1610 and forming a downset portion 1615 of the lead frame 1605 in accordance with step 1510. E.g., conventional stamping or other mechanical processes can be used to bend the metal sheet 1610 to form the downset portion 1615. The downset portion 1615 has an interior surface 1620 and exterior surface 1625.

FIG. 17 shows the package 1600 after forming leads 1705 of the lead frame 1605, in accordance to step 1515. E.g., a layout pattern can be defined on the metal sheet 1610 (FIG. 16) using conventional photolithography techniques (step 1530), and then portions of the metal sheet 1610 that are outside of the layout pattern are removed as part of forming the lead frame 1605 (step 1535). Forming the leads 1705 can include forming positioning 1715 and non-positioning leads 1720 (steps 1540 and 1545). As depicted in FIG. 17, the leads 1705 can comprise short 1725 and long leads 1730, which can be either positioning or non-positioning leads.

FIG. 18 shows the package 1600 after bending a positioning lead 1715 to form a stop 1805 (step 1550).

Figure 19:
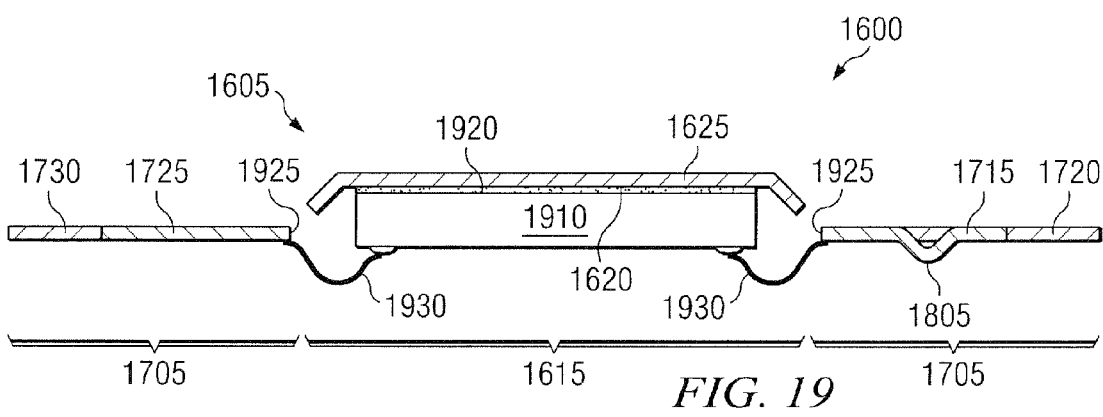

FIG. 19 shows the package 1600 after coupling an IC 1910 to the interior surface 1620 of the downset portion 1615 of the lead frame 1605 (step 1570) via, e.g., an adhesive 1920. FIG. 19 also shows the package after coupling the IC 1910 to first ends 1925 the leads 1705 (step 1575), via, e.g., bonding wires 1930.

Figure 20:
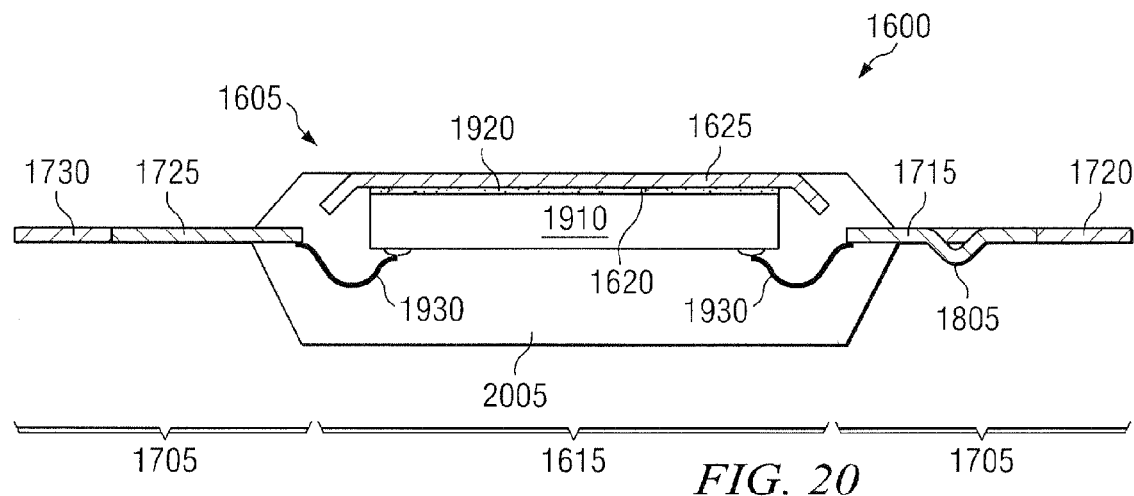

FIG. 20 shows the package after encompassing the IC 1910 and the downset portion 1615, except for the exterior surface 1625, with a mold 2005 (step 1580).

Figure 21:
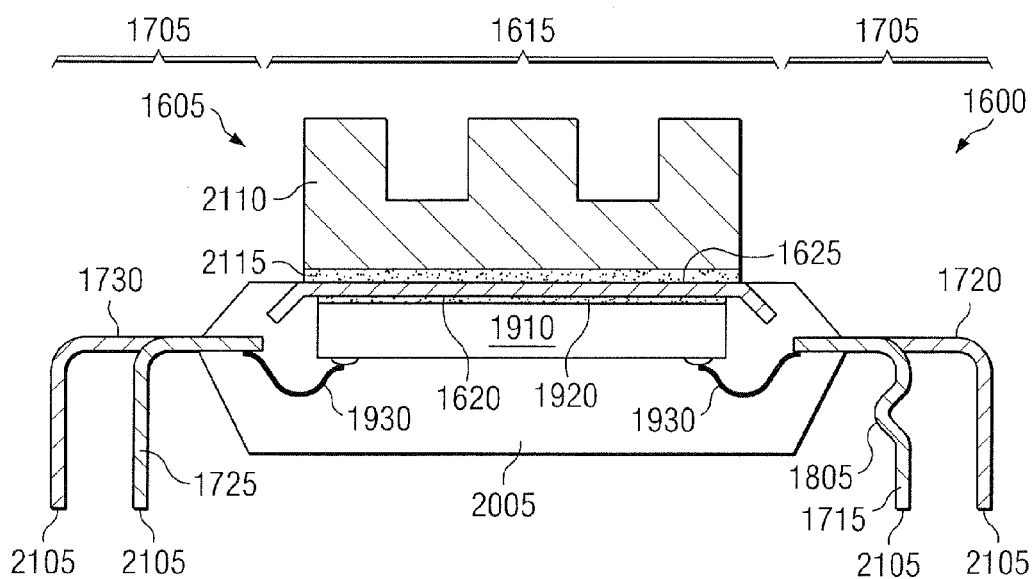

FIG. 21 shows the package 1600 after bending the leads 1705 away from the downset portion 1615 (step 1585). In particular, second ends 2105 of the leads 1705 are bent away from the exterior surface 1625. As discussed in the context of FIG. 14 the second ends 2105 are configured to pass through one of a plurality of mounting holes extending through a mounting board. FIG. 21 also shows the package 1600 after coupling a heat sink 2110 to the exterior surface 1625 of the downset portion 1615 of the lead frame 1605 (step 1590), via, e.g., an second adhesive 2115.

Although the present invention has been described in detail, those skilled in the art should understand that they could make various changes, substitutions and alterations herein without departing from the scope of the invention in its broadest form.

What is claimed is:

1. An integrated circuit (IC) package, comprising:
  a lead frame having a downset portion and leads,
    wherein said downset portion has an exterior surface configured to face away from a mounting board, and an interior surface configured to face towards said mounting board, and
    wherein said leads are bent away from said exterior surface and each of said leads have a first end coupled to an IC and a second end configured to pass through one of a plurality of mounting holes extending through said mounting board, and at least one of said leads is isolated from said downset portion;
  said IC coupled to said interior surface; and
  a mold that encompasses said IC and said downset portion, except for said exterior surface.

2. The IC package as recited in claim 1, further including a heat sink coupled to said exterior surface of said lead frame.

3. The IC package as recited in claim 1, further including:
  a heat sink adhered to said exterior surface of said lead frame.

4. The IC package as recited in claim 1, wherein said mounting board is a double-sided mounting board.

5. The IC package as recited in claim 1, wherein said mounting board is a single-sided mounting board.

6. The IC package as recited in claim 5, wherein said leads comprise:
  one or more positioning lead comprising a stop being a continuous part of said positioning lead and having a lateral dimension greater than a diameter of a first hole of said plurality of mounting holes, and
  one or more non-positioning lead without said stop and having a continuous uniformly shaped body with a lateral dimension less than a diameter of a second hole of said plurality of mounting holes,
    wherein said stop limits an extension of said non-positioning lead through said second hole.

7. The IC package as recited in claim 6, wherein said first end of said at least one isolated lead is encompassed by said mold and at least a portion of said stop is below a bottom surface of said mold.

8. The IC package as recited in claim 6, wherein said stop is configured to prevent a segment of said positioning lead from passing through said first hole, said segment being between said first end and said stop.

9. The IC package as recited in claim 6, wherein said stop is a bend in said positioning lead.

10. The IC package as recited in claim 1, wherein said leads comprises short non-positioning leads interleaved with long non-positioning leads, both said short and long non-positioning leads being coupled to a same side of said IC.

11. The IC package as recited in claim 1, wherein said leads comprise:
- one or more positioning lead comprising a stop being a continuous part of said positioning lead and having a lateral dimension greater than a diameter of a first hole of said plurality of mounting holes, and
- one or more non-positioning lead without said stop and having a continuous uniformly shaped body with a lateral dimension less than a diameter of a second hole of said plurality of mounting holes, wherein said at least one isolated leads includes one or more of said non-positioning leads.

12. The IC package as recited in claim 1, wherein said leads comprise:
- one or more positioning lead comprising a stop being a continuous part of said positioning lead and having a lateral dimension greater than a diameter of a first hole of said plurality of mounting holes, and
- one or more non-positioning lead without said stop and having a continuous uniformly shaped body with a lateral dimension less than a diameter of a second hole of said plurality of mounting holes, wherein said at least one isolated leads includes one or more of said positioning leads.

13. The IC package as recited in claim 1, wherein said leads comprise:
- one or more positioning lead comprising a stop being a continuous part of said positioning lead and having a lateral dimension greater than a diameter of a first hole of said plurality of mounting holes, and
- one or more non-positioning lead without said stop and having a continuous uniformly shaped body with a lateral dimension less than a diameter of a second hole of said plurality of mounting holes, wherein said at least one isolated leads correspond to said non-positioning leads and said positioning leads are attached to said downset portion.

14. An integrated circuit (IC) package, comprising:
a lead frame having a downset portion and leads, wherein said downset portion has an exterior surface configured to face away from a mounting board, and an interior surface configured to face towards said mounting board, and said leads are bent away from said exterior surface, and at least one of said leads is isolated from said downset portion;
an IC adhered to said interior surface;
a heat sink adhered to said exterior surface of said downset portion; and
a mold that encompasses said IC and said downset portion, except for said exterior surface.

* * * * *